United States Patent
Haba et al.

(10) Patent No.: US 9,312,175 B2
(45) Date of Patent: Apr. 12, 2016

(54) SURFACE MODIFIED TSV STRUCTURE AND METHODS THEREOF

(71) Applicant: Invensas Corporation, San Jose, CA (US)

(72) Inventors: Belgacem Haba, Saratoga, CA (US); Fatima Lina Ayatollahi, Fremont, CA (US); Michael Newman, Dublin, CA (US); Pezhman Monadgemi, Fremont, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 13/722,365

(22) Filed: Dec. 20, 2012

(65) Prior Publication Data

US 2014/0175654 A1    Jun. 26, 2014

(51) Int. Cl.
| | | |
|---|---|---|
| *H01L 21/768* | (2006.01) | |
| *H01L 23/50* | (2006.01) | |
| *H01L 23/522* | (2006.01) | |
| *H01L 23/48* | (2006.01) | |

(52) U.S. Cl.
CPC ........ *H01L 21/76898* (2013.01); *H01L 23/481* (2013.01); *H01L 23/50* (2013.01); *H01L 23/5226* (2013.01); *H01L 2924/0002* (2013.01)

(58) Field of Classification Search
USPC .......................................................... 438/637
IPC .................... H01L 23/481,23/505226, 21/76898
See application file for complete search history.

(56) References Cited

U.S. PATENT DOCUMENTS

| | | | |
|---|---|---|---|
| 2007/0045836 A1 | 3/2007 | Kwon et al. | |
| 2009/0305502 A1* | 12/2009 | Lee et al. | 438/667 |
| 2010/0096759 A1* | 4/2010 | Kirby et al. | 257/774 |
| 2010/0178761 A1* | 7/2010 | Chen et al. | 438/613 |
| 2012/0292746 A1 | 11/2012 | Lee et al. | |
| 2013/0026606 A1* | 1/2013 | Farooq et al. | 257/621 |
| 2013/0344655 A1 | 12/2013 | Ohba | |

FOREIGN PATENT DOCUMENTS

WO    2012121344 A1    9/2012

OTHER PUBLICATIONS

International Search Report and Written Opinion for Application No. PCT/US2013/076134 dated Oct. 24, 2014.
Partial International Search Report for Application No. PCT/US2013/076134 dated Jun. 24, 2014.

* cited by examiner

*Primary Examiner* — Marcos D Pizarro
(74) *Attorney, Agent, or Firm* — Lerner, David, Littenberg, Krumholz & Mentlik, LLP

(57) ABSTRACT

Microelectronic elements and methods of their manufacture are disclosed. A microelectronic element may include a substrate including an opening extending through a semiconductor region of the substrate, a dielectric layer cover a wall of the opening within at least a first portion of the opening, a first metal disposed within the first portion of the opening, a second metal disposed within a second portion of the opening. The second metal may form at least part of a contact of the microelectronic element.

16 Claims, 5 Drawing Sheets

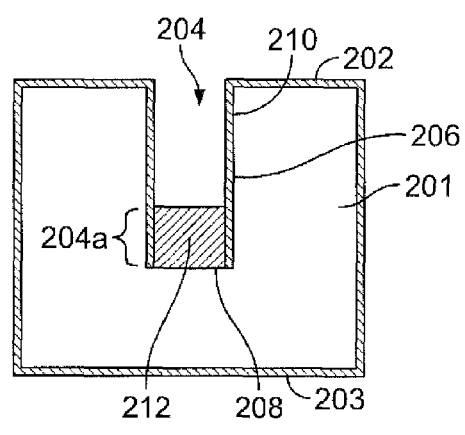
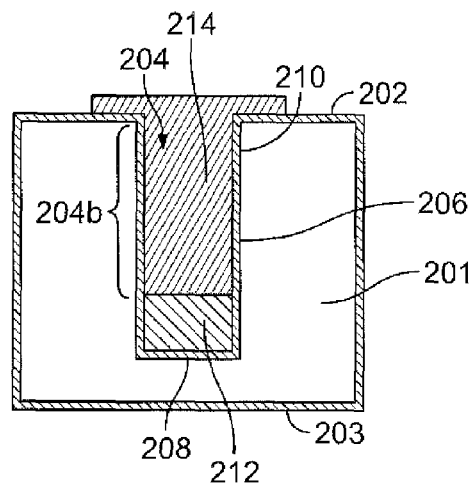
FIG. 13  FIG. 14
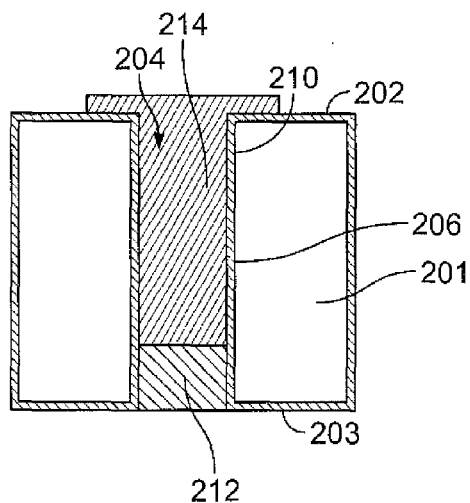
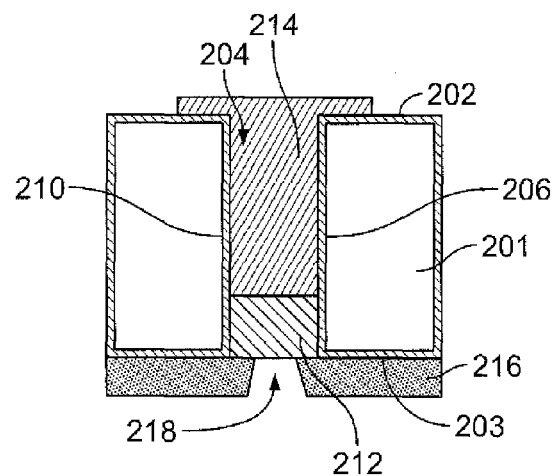
FIG. 15  FIG. 16

SURFACE MODIFIED TSV STRUCTURE AND METHODS THEREOF

BACKGROUND OF THE INVENTION

The subject matter of the present application relates to the packaging of a microelectronic element and related circuitry, for example, a method of making a structure. More particularly, the subject matter of the present application relates to an integrated circuit structure including a through-silicon via (TSV) and methods of its manufacture.

A microelectronic device, such as a semiconductor chip, typically requires many input and output connections to other electronic components. The input and output contacts of a semiconductor chip, or a comparable device, are generally disposed in grid-like patterns that substantially cover a surface of the device (commonly referred to as an "area array") or in elongated rows that may extend parallel to and adjacent to each edge of the device's front surface or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chips during the manufacture and mounting of the chips on an external substrate, such as a circuit board or other circuit panel. Many semiconductor chips are provided in packages suitable for surface mounting. Some types of semiconductor chips have been developed using three-dimensional packaging. A three-dimensional package contains two or more integrated circuits that are stacked vertically so that they occupy less space and/or have greater connectivity. Some three-dimensional packages include through-silicon vias (TSVs) that provide vertical connections through the bodies of the integrated circuits. Typically, the TSV is filled with copper for optimized electrical performance, and the via is revealed using an etching process.

Packages that utilize TSV technology have several advantages over those that have edge wiring including, for example, a higher interconnect density and a smaller form factor. However, while TSV technology has its advantages, there are challenges. For example, the current methods of revealing vias in which copper has been deposited may result in damage to the chip because of the material properties of copper and silicon including the tendency of copper to expand more readily than silicon in response to high temperature. Since the etching process may expose the package to heat, copper components may expand more than the surrounding silicon, damaging the silicon surrounding the copper. Furthermore, copper ions may diffuse or migrate, contaminating electrically active silicon regions or dielectric films. This may damage the package, rendering it unusable.

Therefore, new devices and methods of manufacturing microelectronic packages are desirable.

BRIEF SUMMARY OF THE INVENTION

Disclosed herein are microelectronic elements and a method of manufacturing microelectronic elements.

In an embodiment, a fabrication method for a microelectronic element may include forming an opening extending from a first face of a substrate towards a second face of the substrate opposite thereto. The opening within the substrate may have a substantially constant diameter. The wall of the opening may include a dielectric region. A first metal may be deposited within the opening so as to extend upwardly from a bottom of the opening towards the first face. A second metal, which may be different from the first metal, may be deposited within the opening. The substrate may be abraded from the second face to expose the first metal. The substrate may include a semiconductor region, and the step of forming the opening may include forming the opening through at least a portion of the semiconductor region, and forming the dielectric region along an interior surface of the opening so as to define the wall of the opening. The depositing of the first metal may be performed onto a surface of the semiconductor region exposed at least at the bottom of the opening. The second face may be abraded to expose at least a portion of the dielectric region. The first metal may include at least one of a nickel or nickel alloy. The second metal may include at least one of a copper or copper alloy. A portion of the dielectric region may remain exposed within the opening after depositing the first metal. A solder mask may be deposited upon the second face, and an opening may be formed in the solder mask. Solder may be deposited in the opening, and the solder may contact the first metal.

In another embodiment, a fabrication method for a microelectronic element may include forming an opening extending from a first face of a substrate towards a second face of the substrate opposite thereto. A wall of the opening may include a dielectric region. A bottom of the opening may be enlarged such that a first portion of the opening has a first width and a second portion of the opening has a second width. The first width may be greater than the second width. A first metal may be deposited within at least the first portion of the opening so as to extend upwardly form the bottom of the opening. A second metal may be deposited within the second portion of the opening. The second metal may be different from the first metal. The substrate may be abraded from the second face to expose the first metal. The exposed first metal may be at least a part of a contact of the microelectronic element exposed at the second face of the substrate. The substrate may include a semiconductor region, and the step of forming the opening may include forming the opening through at least a portion of the semiconductor region, and forming the dielectric region along an interior surface of the opening so as to define the wall of the opening. The step of enlarging the bottom of the opening may include isotropically etching the bottom.

In an embodiment, a microelectronic element may include a substrate including a first face and a second face opposite the first face. An opening may extend through the substrate, and may include a first portion extending from the first face and a second portion extending from the second face. The opening may include a wall, and a dielectric region at the wall within at least the second portion of the opening. A first metal may be disposed within the first portion of the opening and may extend within the opening to a first height from the first face towards the second face. The first metal may include at least one of a nickel or nickel alloy. A second metal may extend from the first metal to a second height in the opening greater than the first height. The second metal may include at least one of a copper or copper alloy. The first metal may have a width in a first direction parallel to the first face, and the second metal may have a second width in the first direction. The first width may be greater than the second width. A portion of the second metal may project above the first face of the substrate and may be laterally enclosed by the dielectric region. The first metal may be configured to be at least a part of a contact of the microelectronic element at the first face. The substrate may include a semiconductor region. The opening may extend through at least a portion of the semiconductor region. The dielectric region at the wall may overly an interior surface of the semiconductor region within the opening. A solder mask may be in contact with the first face and may include an opening in which solder is disposed. The solder may contact the first metal.

These and other embodiments of the present disclosure are more fully described hereinbelow.

BRIEF DESCRIPTION OF THE DRAWINGS

Embodiments of the present disclosure are described with reference to the accompanying drawings, in which:

FIGS. 11-16 illustrate stages in a method of fabricating the microelectronic element of FIG. 10 in accordance with another embodiment of the present disclosure.

DETAILED DESCRIPTION

Figure 1:
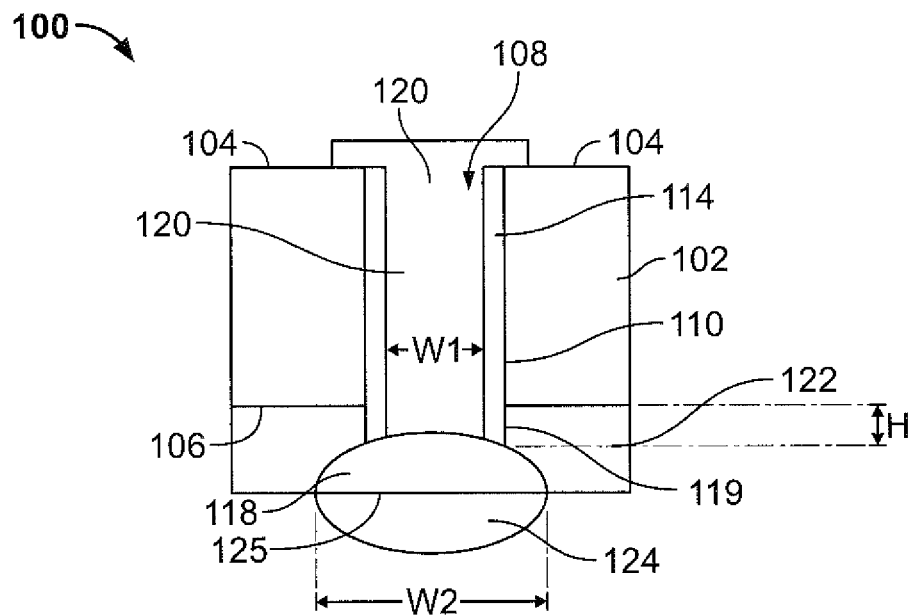
FIG. 1 is a cross-sectional view of a microelectronic element in accordance with an embodiment of the present disclosure.

Particular embodiments of the present disclosure are described with reference to the accompanying drawings. In the figures and in the description that follow, like reference numerals identify similar or identical elements.

As shown in FIG. 1, a microelectronic element 100 may include a semiconductor region 102 having a first face 104 and a second face 106. In one example, the semiconductor region may consist essentially of silicon. A via or opening 108 extends through region 102 from first face 104 to second face 106. Opening 108 may have a variety of configurations including generally cylindrical. Opening 108 may include a wall 110, and may have a width W1. A dielectric layer 114 may cover wall 110 and may extend beyond second face 106 of region 102. A first metal 118 may be disposed at a first end 119 of the opening 108, and may have a width W2 that is wider than width W1 of opening 108. In one embodiment, first metal 118 can be wettable by solder and deposited such as by plating. The first metal may be a type having a much lower diffusion rate into silicon and silicon oxides than copper which tends to diffuse at a high rate and can spoil silicon and silicon oxides. For example, first metal 118 may be a nickel or a nickel alloy. A second metal 120 may fill the remainder of opening 108. Second metal 120 may be a copper or a copper alloy. A portion 119 of the dielectric layer may project above the second face 106, i.e., to a height H above the second face 106, and the second metal 120 may also protrude to such height H. A solder mask 122 may be disposed on second face 106 in contact with a portion 119 of dielectric layer 114 extending beyond the second face, and may also surround a portion of first metal 118 and second metal 120. A conductive material 124, such as solder, may be disposed on a surface 125 of second metal 118.

Figure 1A:
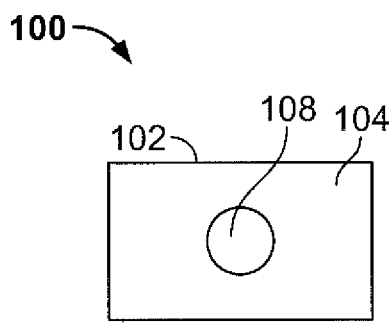
FIG. 1A is a top view of a microelectronic element in accordance with another embodiment of the present disclosure.
Figure 1B:
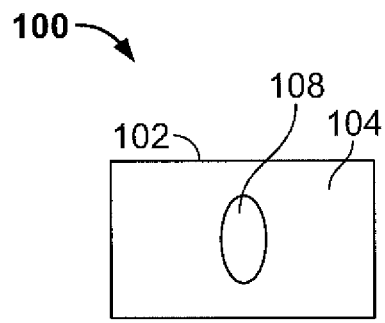
FIG. 1B is a top view of a microelectronic element in accordance with yet another embodiment of the present disclosure.
Figure 1C:
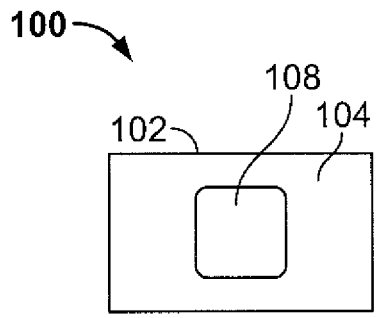
FIG. 1C is a top view of a microelectronic element in accordance with a still further embodiment of the present disclosure.
Figure 1D:
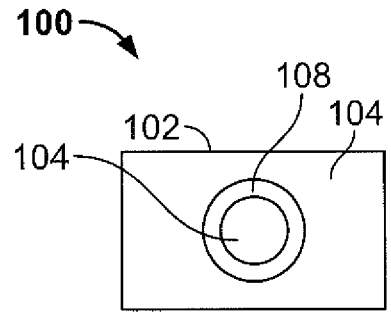
FIG. 1D is a top view of a microelectronic element in accordance with still another embodiment of the present disclosure.

In an embodiment, the semiconductor region 102 may have a thickness in a range between 50 and 1000 micrometers. In other embodiments, the thickness of the semiconductor region 102 may be less than 50 micrometers. In an embodiment, the opening 108 may have width in a range between 3 and 100 micrometers. In another embodiment, the width W1 of the opening 108 may be between 1 and 10 micrometers. In yet another embodiment, the width W1 of the opening 108 may be less than 1 micrometer. The opening 108 may have a variety of shapes and configurations. As shown in FIG. 1A, the opening 108 may be circular. As shown in FIG. 1B, the opening 108 may be ovaloid. As shown in FIG. 1C, the opening 108 may be generally rectangular, and the edges of the opening 108 may be rounded. As shown in FIG. 1D, the opening 108 may be toroidal, i.e., ring-shaped.

Figure 2:
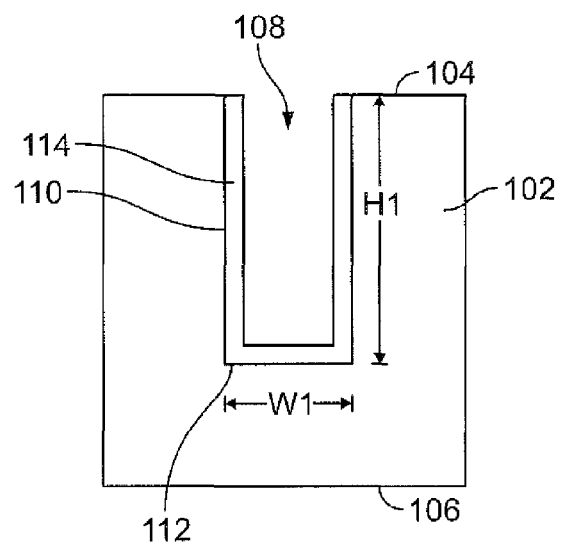
FIGS. 2-9 illustrate stages in a method of fabricating the microelectronic element of FIG. 1 in accordance with an embodiment of the present disclosure.

The stages of forming microelectronic element 100 are described with reference to FIGS. 2-7. As shown in FIG. 2, region 102 has first face 104 and second face 106. Opening 108 may be formed extending from first face 104 toward second face 106 through a portion of semiconductor region 102 by a length H1 and may have a width W1. Length H1 may be greater than width W1. At this stage, opening 108 extends only through a portion of the region 102 and includes wall 110 and a bottom 112. Dielectric layer 114 is deposited within opening 108 and may cover wall 110 and bottom 112 of the opening. Dielectric layer 114 may be formed from a material including silicon dioxide or the like.

Figure 3:
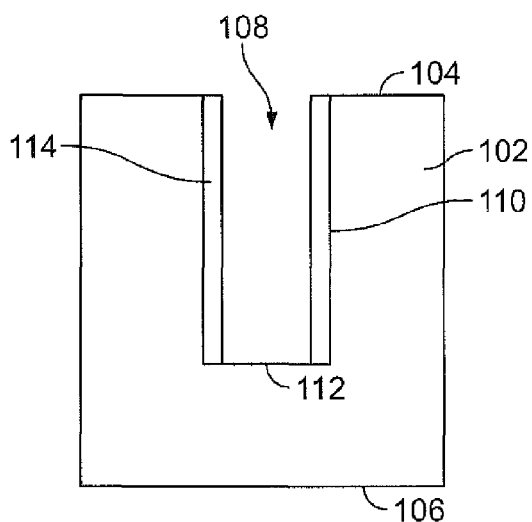

As shown in FIG. 3, bottom 112 of opening 108 may be etched to remove a portion of dielectric layer 114 from the bottom of the opening, thereby exposing the bottom beyond the dielectric layer. During this etching process, the thickness of dielectric layer 114 may taper or narrow approaching second face 106, and a portion of wall 110 may become exposed. A pad nitride, such as silicon nitride may be deposited on first face 104 to protect the first face during the etching process.

Figure 4:
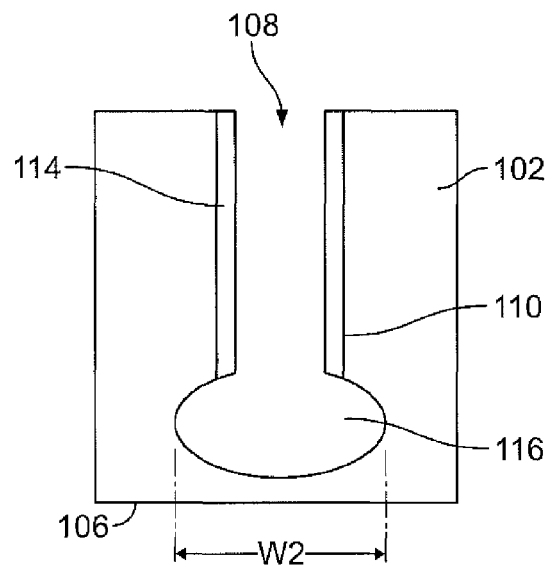

As shown in FIG. 4, bottom 112 of opening 108 may be enlarged to form an enlarged area 116 having width W2, which is greater than width W1 of opening 108. Enlarged area 116 may be formed by an isotropic etching process, which may include depositing an etchant such as xenon difluride, sulfur hexafluoride, or the like within opening 108.

Figure 5:
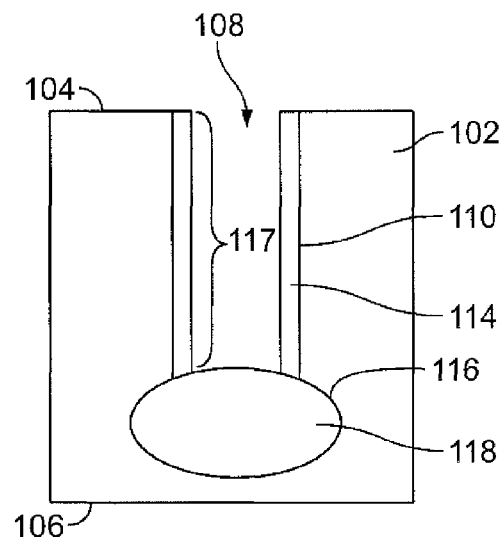
Figure 6:
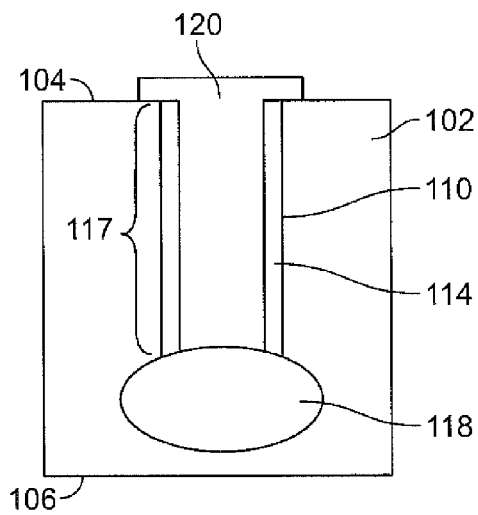
Figure 7:
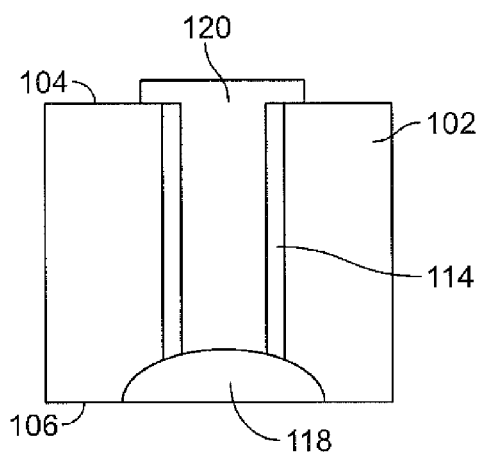

As shown in FIG. 5, first metal 118 may fill at least a portion of enlarged area 116 of opening 108, leaving a remaining portion 117 of the opening unfilled. Alternatively, first metal 118 may line or coat the surface of enlarged area 116 (not shown). As shown in FIG. 6, remaining portion 117 may be filled with a second metal 120. Second metal 120 may include a copper or a copper alloy. As shown in FIG. 7, the second face 106 of the region 102 may be abraded, e.g., ground, to expose the first metal 118 from the second face. The first metal 118 and the second metal 120 may be electrically conductive, and may together form part of a conductive via. The majority of the opening 108 may be filled with the second metal.

Figure 8:
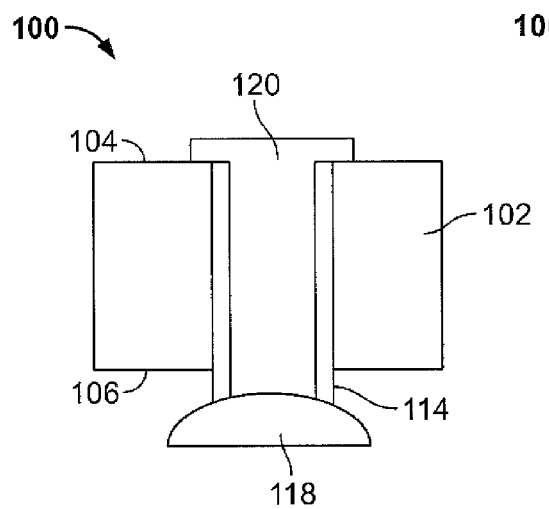
Figure 9:
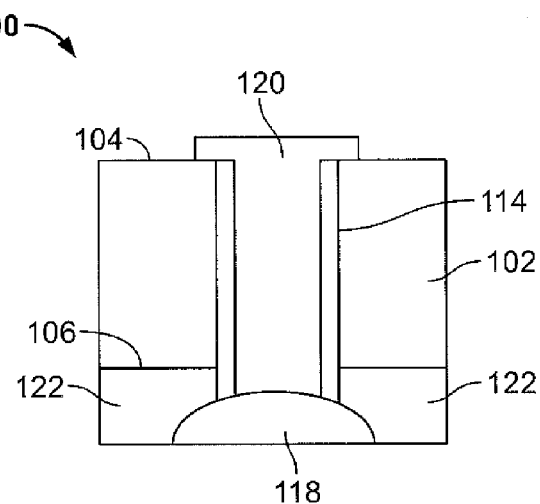

In one example, the first metal 118 may create a spacing between the second metal 120 and the second face 106 of the region 102 such that during abrasion of the second face such that exposure of the second face is inhibited and the likelihood of contamination of the semiconductor or dielectric regions by the second metal is greatly reduced. The exposed first metal 118 may form at least part of a contact. Since the enlarged area 116 has a greater width than that of the opening 108, the exposed first metal 118 may shield the dielectric layer 114 from the second face 106. At least a portion of the dielectric layer 114 may be exposed by further etching the second face 106 and around the sides of the deposited first metal 118, as shown in FIG. 8. The region 102 may be isotropically etched from the second face 106 by applying an etchant, such as xenon difluoride, sulfur hexafluoride, or the like to the second face. As shown in FIG. 9, a solder mask 122 may be deposited around the exposed portion 119 of the dielectric layer 114 and the exposed first metal 118. The exposed first metal 118 may form part of an electrical contact, and solder 124 may be deposed onto a surface of the exposed first metal (as shown in FIG. 1), and the solder is automatically aligned with first and second metals 118, 120, respectively.

In one example, a single opening 108 is used to receive first metal 118 and second metal 120 therein. If a single metal such as copper or copper alloy were deposited in a via or opening within a substrate instead, abrading a face of the substrate to reveal the opening would require great care not to contact the metal lest ions from the copper diffuse into the substrate. In the method described above, it is possible to abrade the substrate until first metal 118 forms an exposed conductive pad. This is possible because first metal 118 inhibits contact with second metal 120 and thus prevents the second metal from poisoning the substrate during the step of abrading the substrate. Thus, where second metal 120 includes a copper or copper alloy, abrasion of the second face 106 does not pose the possibility of copper contamination. If only copper were present and no first metal such as nickel, copper contamination might be prevented by forming the via in stages in which a via or opening is formed extending from a first face and copper or copper alloy is deposited therein, and then a via or opening is formed from a second face and copper or copper alloy is deposited therein. This would necessitate a complex process of aligning the two openings which were formed in the above described stages. Since in the above described method, first metal 118 and second metal 120 are deposited within the same opening 108, the first and second metals are automatically aligned, and there is no need to ensure alignment, nor is any other complex passivation and/or wiring method required.

Figure 10:
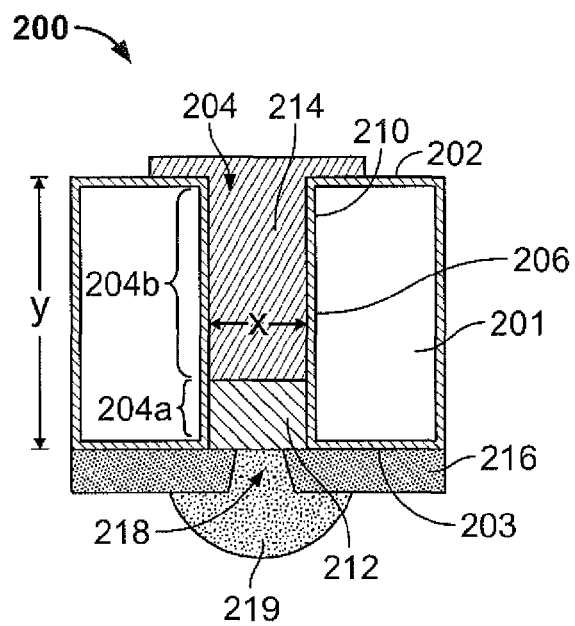
FIG. 10 is a cross-sectional view of a microelectronic element in accordance with another embodiment of the present disclosure.

In another embodiment, as shown in FIG. 10, a microelectronic element 200 may include a semiconductor material or substrate 201 having a first face 202 and a second face 203. A via or opening 204 may extend through substrate 201 from first face 202 to second face 203. Opening 204 may have a substantially uniform width x along its length y. Opening 204 may have a variety of configurations including cylindrical. Opening 204 may have a first portion 204a and a second portion 204b. Opening 204 may have a wall 206 that is covered by a dielectric layer 210, which may be formed from a material including silicon dioxide or the like. Dielectric layer 210 may cover substantially the entire length y of opening 204 and may extend through second face 203 of substrate 201. A first metal 212 may be disposed within first portion 204a and may be exposed at second face 203 of substrate 201. The first metal may be a type having a much lower diffusion rate into silicon and silicon oxides than copper which tends to diffuse at a high rate and can spoil silicon and silicon oxides. For example, first metal 118 may be a nickel or a nickel alloy. A second metal 214 may fill second portion 204b of opening 204. Second metal 214 may be a copper or a copper alloy. A solder mask 206 may be disposed on second face 203 of substrate 201, and may include an opening 218 to expose first metal 212. A conductive metal 219, such as solder, may be disposed within opening 218 solder mask 216 in connection with first metal 212 to form an electrical contact.

Figure 11:
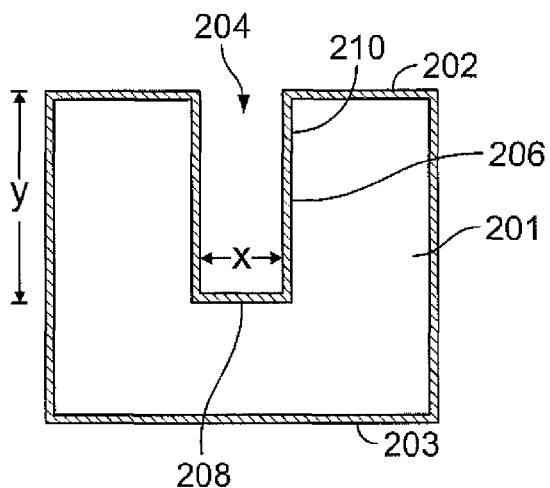

The stages of forming microelectronic element 200 are described with reference to FIGS. 11-16. As shown in FIG. 11, substrate 201 includes first face 202 and second face 203. Opening 204 may be formed extending through first face 202 partially through substrate 201 by length y, and may have a substantially uniform width along that length. Opening 204 may have a generally cylindrical configuration, and/or may include wall 206 and bottom 208. Dielectric layer 210 may be deposited within opening 204 to cover wall 206 and bottom 208 of opening 204.

Figure 12:
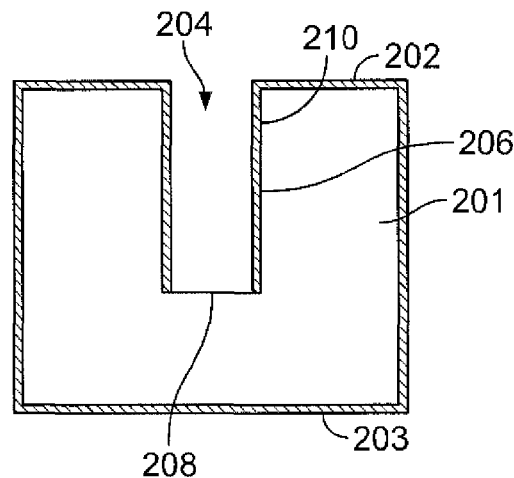

As shown in FIG. 12, bottom 208 may be etched to remove dielectric layer 210 from the bottom and to expose substrate 201. During this etching process, the thickness of dielectric layer 210 may taper or narrow approaching second face 203, and a portion of wall 206 may become exposed. As shown in FIG. 13, a first metal 212 may be deposited within first portion 204a of opening 204 so that the first metal extends from bottom 208 in a direction toward first face 202. As shown in FIG. 14, second metal 214 may be deposited within second portion 204b, extending from first metal 212 in a direction toward first face 202. As shown in FIG. 15, second face 203 may be abraded, e.g., by grinding, lapping or polishing, to remove a portion of substrate 201 to expose first metal 212 and/or dielectric layer 210 within opening 204. Since second metal 214 is separated from first face 203 by first metal 212, the possibility of contamination of substrate 201 by the second metal is minimal during this step of abrading.

Solder mask 216 may be placed onto second face 203 of substrate 201. Solder mask 216 may be formed from a photoimageable material such that a pattern may be formed within the solder mask using photoimaging processes. An opening 218 may be formed within solder mask 216 to expose first metal 212. Conductive metal 219, such as solder, may be deposited within opening 218 of solder mask 216 in connection with first metal 212 to form part of an electrical contact for microelectronic element 200. Since first metal 212 and second metal 214 are deposited within the same opening 204, the first and second metals are automatically aligned and in contact with one another, thereby eliminating the need for complex alignment, passivation and/or wiring when, for example, forming an electrical contact on second face 203.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A fabrication method for a microelectronic element, the method comprising:
   forming an opening extending from a first face of a substrate towards a second face of the substrate opposite thereto, wherein a wall of the opening includes a dielectric region;
   depositing a first metal within the opening so as to extend upwardly from a bottom of the opening towards the first face, wherein a portion of the dielectric region remains exposed within the opening after depositing the first metal;
   depositing a second metal within the opening, the second metal being different from the first metal; and
   abrading the substrate from the second face to expose the first metal.

2. The method of claim 1, wherein the abrading step includes abrading at least a portion of the first metal.

3. The method of claim 1, further comprising:
   depositing a solder mask upon the second face;

forming an opening in the solder mask; and
depositing solder in the opening, wherein the solder contacts the first metal.

4. The method of claim 1, further comprising etching the bottom of the opening to remove a dielectric layer and expose the substrate.

5. The method of claim 4, further comprising enlarging the bottom of the opening such that a first portion of the opening has a first width and a second portion of the opening has a second width, the first width being greater than the second width.

6. A fabrication method for a microelectronic element, the method comprising:
   forming an opening extending from a first face of a substrate towards a second face of the substrate opposite thereto, wherein a wall of the opening includes a dielectric region;
   depositing a first metal within the opening so as to extend upwardly from a bottom of the opening towards the first face;
   depositing a second metal within the opening, the second metal being different from the first metal; and
   abrading the substrate from the second face and at least a portion of the first metal to expose the first metal, the abrading performed such that the second metal remains separated from the abraded second face of the substrate by at least the first metal; and
   wherein a portion of the dielectric region remains exposed within the opening after depositing the first metal.

7. The method of claim 6, wherein the substrate includes a semiconductor region, and the forming the opening includes forming the opening through at least a portion of the semiconductor region, and forming the dielectric region along an interior surface of the opening so as to define the wall of the opening.

8. The method of claim 6, wherein the exposed first metal is at least a part of a contact of the microelectronic element exposed at the second face of the substrate.

9. The method of claim 6, wherein the second metal is deposited after the first metal is deposited.

10. A fabrication method for a microelectronic element, the method comprising:
    forming an opening extending from a first face of a substrate towards a second face of the substrate opposite thereto, wherein a wall of the opening includes a dielectric region, wherein the substrate includes a semiconductor region, and the forming of the opening includes forming the opening through at least a portion of the semiconductor region, and forming the dielectric region along an interior surface of the opening so as to define the wall of the opening;
    depositing a first metal within the opening so as to extend upwardly from a bottom of the opening towards the first face;
    depositing a second metal within the opening, the second metal being different from the first metal; and
    abrading the substrate from the second face and at least a portion of the first metal to expose the first metal, the abrading performed such that the second metal remains separated from the abraded second face of the substrate by at least the first metal; and
    wherein the depositing of the first metal is performed onto a surface of the semiconductor region exposed at least at the bottom of the opening.

11. The method of claim 10, further comprising abrading the second face to expose at least a portion of the dielectric region.

12. The method of claim 10, wherein the first metal includes at least one of a nickel or nickel alloy.

13. The method of claim 10, wherein the second metal includes at least one of copper or copper alloy.

14. The method of claim 10, further comprising:
    depositing a solder mask upon the second face;
    forming an opening in the solder mask; and
    depositing solder in the opening, wherein the solder contacts the first metal.

15. The method of claim 10, wherein the opening within the substrate has a substantially constant diameter.

16. The method of claim 10, wherein the second metal is deposited after the first metal is deposited.

* * * * *